(12) United States Patent
Bruchhaus et al.

(10) Patent No.: US 7,361,549 B2
(45) Date of Patent: Apr. 22, 2008

(54) METHOD FOR FABRICATING MEMORY CELLS FOR A MEMORY DEVICE

(75) Inventors: Rainer Bruchhaus, Munich (DE); Martin Gutsche, Dorfen (DE)

(73) Assignee: Infineon Technologies AG, Munich (DE)

( * ) Notice: Subject to any disclaimer, the term of this patent is extended or adjusted under 35 U.S.C. 154(b) by 280 days.

(21) Appl. No.: 11/185,473

(22) Filed: Jul. 20, 2005

(65) Prior Publication Data
US 2006/0046317 A1 Mar. 2, 2006

(30) Foreign Application Priority Data
Aug. 31, 2004 (DE) .................. 10 2004 042 071

(51) Int. Cl.
*H01L 21/8242* (2006.01)
(52) U.S. Cl. .................. 438/253; 438/240; 438/387; 438/396; 438/399; 438/570; 257/E21.009; 257/E21.644; 257/E21.646; 257/E21.648
(58) Field of Classification Search ............... 438/240, 438/253, 387, 396, 399, 570; 257/E21.009, 257/E21.664, E21.646, E21.648
See application file for complete search history.

(56) References Cited
U.S. PATENT DOCUMENTS 6,242,299 B1 * 6/2001 Hickert .................. 438/240
6,773,986 B2 * 8/2004 Bruchhaus et al. ......... 438/253
2003/0129796 A1 * 7/2003 Bruchhaus et al. ......... 438/239
2004/0262655 A1 * 12/2004 Kweon ..................... 257/295

FOREIGN PATENT DOCUMENTS

| DE | 19640413 | 4/1998 |
| DE | 19834649 | 3/2000 |
| DE | 10131490 | 1/2003 |

* cited by examiner

*Primary Examiner*—Michelle Estrada
*Assistant Examiner*—Jarret J Stark
(74) *Attorney, Agent, or Firm*—Jenkins, Wilson, Taylor & Hunt, P.A.

(57) ABSTRACT

The invention provides a method for fabricating a memory device having memory cells which are formed on a microstructured driving unit (100), in which method a shaping layer (104) is provided and is patterned in such a manner that vertical trench structures (105) are formed perpendicular to the surface of the driving unit (100). Deposition of a seed layer (106) on side walls (105a) of the trench structures (105) allows a crystallization agent (107) which has filled the trench structures (105), during crystallization, to have grain boundaries perpendicular to electrode surfaces that are to be formed. This provides memory cells based on vertical ferroelectric capacitors in a chain FeRAM structure.

21 Claims, 9 Drawing Sheets

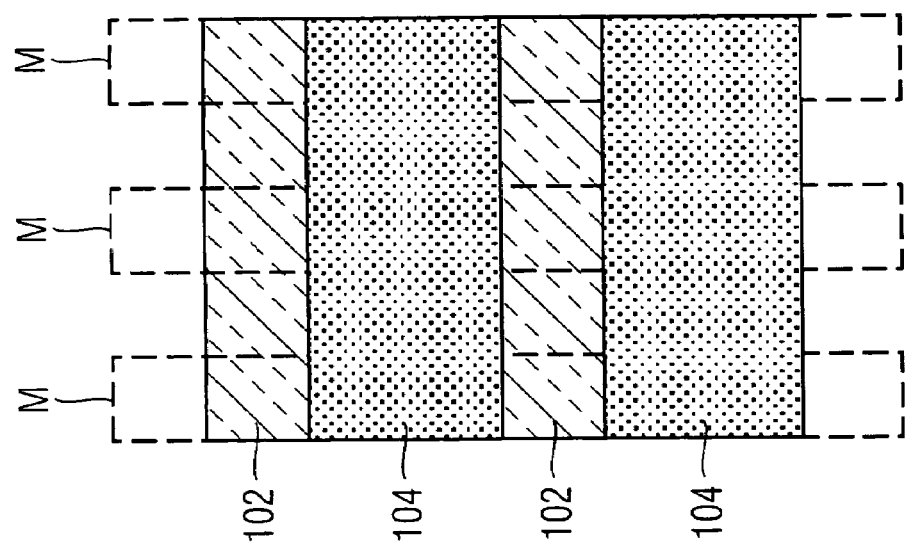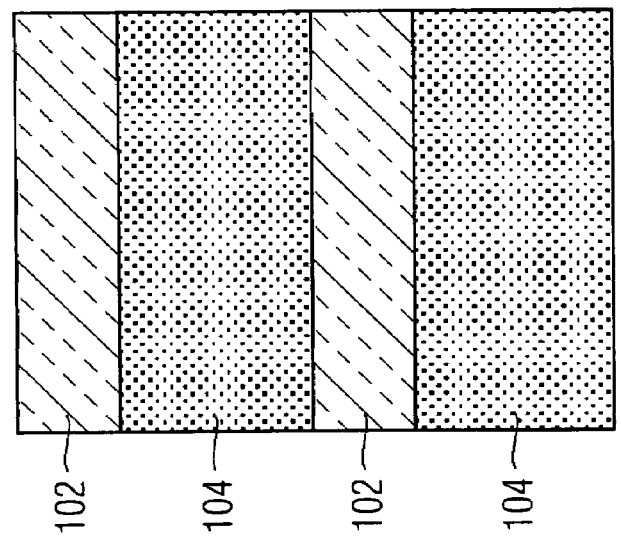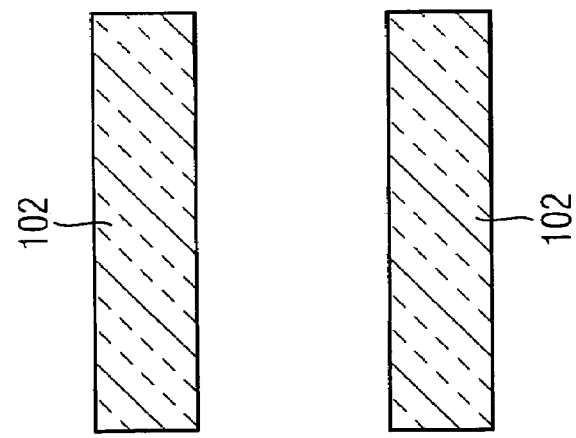

METHOD FOR FABRICATING MEMORY CELLS FOR A MEMORY DEVICE

TECHNICAL FIELD

The present invention relates to a memory device with integrated memory cells, and relates in particular to a memory device with memory cells based on ferroelectric capacitors with a high aspect ratio.

BACKGROUND ART

Specifically, the present invention relates to a method for fabricating a memory device which has memory cells and devices for causing the memory cells to respond; trench structures are formed by microtechnology and can be filled with a crystallization agent which, after crystallization, has regions allowing ferroelectric storage of an item of information.

Ferroelectric data memories, also known as FeRAMs (FeRAM=FerroElectric Random Access Memory) are based on the ferroelectric effect. Ferroelectric materials are materials which have a spontaneous polarization which can be reversed in an electric field. A material which is preferably used in the ferroelectric storage capacitors is lead zirconate titanate (PZT, $Pb(Zr, Ti) O_3$ for short).

Memory devices based on ferroelectric memory cells have the advantage of not requiring a refresh cycle, which for conventional memory cells based on electrical capacitors is typically 64 ms (milliseconds). The spontaneous polarization is retained even after the operating voltage has been switched off, which means that the information is stored in nonvolatile form and there is no need for a refresh cycle.

One drawback of modern conventional FeRAMs consists in the fact that the storage density which can be achieved is only low compared to dielectric data memories, such as for example DRAMs. A typical storage density for an FeRAM is, for example, 256 kBit. It is therefore important to increase the storage density of memory devices with PZT-based memory cells.

To solve this problem, DE 195 43 539 C1 proposes a method for fabricating a memory cell arrangement in which stacked capacitors with a ferroelectric or a paraelectric storage dielectric are used. According to the device disclosed in DE 195 43 539 C1, the stacked capacitors are designed as vertical storage capacitors. To fabricate a storage capacitor of this type, a dielectric layer is produced over the entire surface area for the storage dielectric. Then, the dielectric layer is patterned and first electrodes and second electrodes for the storage capacitors are formed. Select transistor pairs for corresponding memory cells which belong to adjacent word line pairs are arranged offset in the substrate in the customary way.

SUMMARY OF THE INVENTION

Therefore, one drawback of conventional memory devices with PZT-based memory cells is that vertically arranged ferroelectric capacitors as memory cells cannot be fabricated in a chain architecture if the ferroelectric capacitors are to have low layer thicknesses. Furthermore, the storage density of conventional memory devices with PZT-based memory cells is disadvantageously inadequate.

Therefore, it is an object of the present invention to provide a method for fabricating a memory device which has memory cells based on ferroelectric capacitors which can be arranged in a chain structure, in such a manner that select transistors and associated storage capacitors can be arranged in an efficient and space-saving way for a high storage density.

According to the invention, this object is achieved by a method as described in Patent Claim 1. Furthermore, the object is achieved by a ferroelectric memory cell according to claim 23. Moreover, the object is achieved by a memory device according to claim 24.

Further configurations of the invention will emerge from the subclaims.

One main concept of the invention consists in fabricating memory cells by filling pre-patterned openings by a specific side wall treatment in a shaping layer and then providing a heat treatment and transformation into a crystalline phase of a ferroelectric PZT in a vertically arranged ferroelectric capacitor.

The method according to the invention has the advantage of allowing the fabrication of memory cells based on PZT with a high aspect ratio and a high packing density. The method according to the invention opens up the possibility of influencing the direction of growth of PZT layers which form the interior of a storage capacitor in such a manner that the grain boundaries of the PZT crystallites are oriented parallel to the profile of the internal electric field of the storage capacitor.

A further advantage is that the method according to the invention can provide both vertical ferroelectric storage capacitors and a chain arrangement (chain FeRAM structure), in such a manner that a high storage density can be achieved.

According to a general aspect, the method according to the invention for fabricating a memory device which includes memory cells and devices for causing the memory cells to respond substantially includes the following steps:

a) forming a microstructured driving unit for driving memory cells, by providing a substrate having an insulation layer deposited thereon, in which insulation layer select transistor units, each with diffusion barrier layers applied to them, are embedded;

b) depositing a stop layer on the microstructured driving unit;

c) depositing a shaping layer on the stop layer;

d) patterning the deposited shaping layer, in such a manner that vertical trench structures are formed perpendicular to the surface of the driving unit;

e) depositing a seed layer on the patterned shaping layer, in such a manner that the seed layer covers side walls and a base of the trench structures;

f) filling the trench structures with a crystallization agent;

g) crystallizing the crystallization agent, in such a manner that grain boundaries of a crystallization filling which forms are oriented perpendicular to the side walls of the trench structures;

h) etching the crystallization filling at the top side of the layer stack formed in steps a) to g), in such a manner that the surface of the shaping layer is uncovered;

i) depositing a covering layer on the etched crystallization filling and the uncovered regions of the shaping layer;

j) chemical-mechanical polishing (CMP) the covering layer, in such a manner that a region comprising a part of the covering layer is retained on the surface of the crystallization filling;

k) removing the shaping layer and the side regions of the seed layer, in such a manner that electrode holes are formed; and l) depositing an electrode material in the electrode holes.

The subclaims give advantageous refinements and improvements of the corresponding subject matter of the invention.

It is advantageous for the substrate provided to be a silicon Si material. Consequently, the insulation layer deposited on the substrate can advantageously be formed from a silicon dioxide $SiO_2$ material.

According to a preferred refinement of the present invention, the select transistors comprise terminal elements composed of a tungsten material. According to yet another preferred refinement of the present invention, the diffusion barrier layers which are in each case applied to the select transistors comprise an iridium/iridium oxide layer stack.

In this context, it is preferable for the iridium oxide material to be arranged on the iridium material. According to yet another preferred refinement of the present invention, the stop layer is formed from an aluminium oxide $Al_2O_3$ material.

In a first exemplary embodiment of the present invention, the shaping layer is provided in the form of an insulation material. According to a second exemplary embodiment of the present invention, the shaping layer is provided in the form of a metal or a metallic material. In this case, the metal or the metallic material, following the step of patterning the shaping layer, is removed between the memory elements, in such a manner that the vertical trench structures are formed perpendicular to the surface of the driving unit, with the space which is formed being filled with an insulation material.

The metal or metallic material which forms the shaping layer is preferably provided from ruthenium/ruthenium dioxide ($Ru/RuO_2$) or polysilicon.

The insulation material can in this case be provided from silicon dioxide $SiO_2$. According to yet another preferred refinement of the present invention, the patterning of the deposited shaping layer in such a manner that the vertical trench structures are formed perpendicular to the surface of the driving unit provides the vertical trench structures in an aspect ratio of greater than 10.

It is preferable for the vertical trench structures to be elongated in a direction parallel to the substrate by the patterning of the deposited shaping layers.

The seed layer preferably consists of a titanium oxide ($TiO_2$) material. According to yet another preferred refinement of the present invention, the seed layer is deposited on the patterned shaping layer by means of an atomic layer deposition (ALD) process. According to yet another preferred refinement of the present invention, the seed layer is removed from the bases of the trench structures prior to the step of filling the trench structures with a crystallization agent.

It is preferable for the seed layer to be removed from the bases of the trench structures in this way by means of an anisotropic etching process (RIE=reactive ion etching).

According to a further preferred refinement of the present invention, the crystallization of the crystallization agent is carried out at a temperature in a range from 500° C. to 750° C.

In this case, the crystallization agent is preferably formed from a lead zirconate titanate material ($Pb(Zr, Ti)O_3$; PZT).

It is preferable for the removal of the shaping layer and of the lateral regions of the seed layer in such a manner that electrode holes are formed to be carried out selectively with respect to the crystallization filling by means of an anisotropic etching process (RIE).

The electrode material which is deposited in the electrode holes preferably contains iridium oxide and/or ruthenium oxide.

The invention therefore makes it possible to provide a method in which PZT-based memory cells are fabricated in an efficient and space-saving way, with the grain boundaries formed during crystallization being oriented perpendicular to the electrode surface of the storage capacitor which is formed, i.e. parallel to the profile of the field lines in the storage capacitor.

Exemplary embodiments of the invention are illustrated in the drawings and explained in more detail in the description which follows.

BRIEF DESCRIPTION OF THE DRAWINGS

FIGS. 14(a), (b) and (c) show views of a fabrication process made up of alternating strips of polysilicon and silicon dioxide in accordance with a further preferred exemplary embodiment of the present invention.

DETAILED DESCRIPTION OF THE INVENTION

In the figures, identical reference symbols denote identical or functionally equivalent components or steps.

Figure 1:
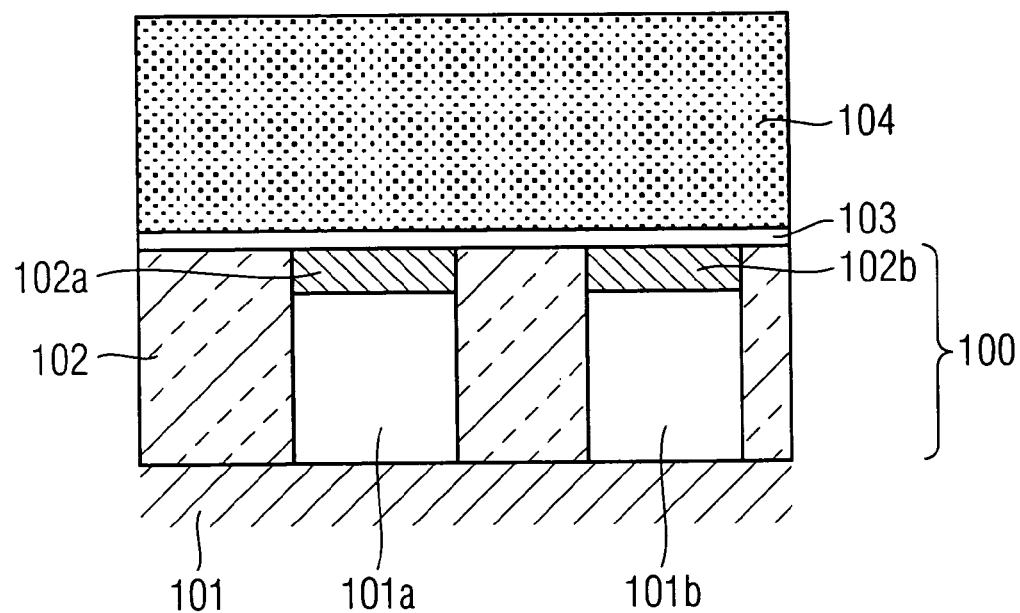
FIG. 1 shows a substrate with a micro-patterned driving unit for memory cells applied to it, with select transistor units each having diffusion barrier layers applied to them embedded in an insulation layer deposited on the substrate, and with a stop layer and a shaping layer.

FIG. 1 shows a starting state illustrating the method according to the invention for fabricating a memory device which includes memory cells and devices for causing the memory cells to respond. A reference numeral 100 denotes a driving unit for memory cells, which includes select transistor units 101a and 101b with diffusion barrier layers 102a and 102b applied to them.

It should be noted that the structure of driving units for memory cells of this type is known to the person skilled in the art, and consequently the functioning of such driving units is not explained further in the text which follows. The present invention relates to the design of the storage capacitor of a memory cell itself, which will be explained with reference to the process steps illustrated in FIGS. 1 to 15.

Furthermore, an insulation layer 102, in which the select transistor units 101a and 101b and the diffusion barrier layers 102a and 102b are embedded, has been applied to the substrate 101. The insulation layer 102 preferably consists of a silicon dioxide ($SiO_2$) material. A stop layer 103 has been applied to the upper surface, i.e. the surface which lies parallel to the substrate surface opposite the driving unit, of the driving unit 100.

The stop layer 103 which has been applied to the driving unit 100 is used to protect the select transistor units below from the elements which are to be produced above. The stop layer is preferably formed from an aluminium oxide ($Al_2O_3$) material.

It is preferable for the select transistor units 101a and 101b to have terminal elements composed of a tungsten material. The substrate 101 is preferably formed from silicon (Si). The diffusion barrier layers 102a and 102b are preferably formed from an iridium/iridium oxide layer stack, with the iridium oxide formed on the iridium.

As is also shown in FIG. 1, a shaping layer 104, which is used to shape the storage capacitors to be formed, has been deposited on the stop layer 103. The shaping layer is preferably provided in the form of an insulation material. In a first preferred embodiment of the present invention, the insulation material of the shaping layer is formed from a silicon dioxide ($SiO_2$) material.

In a further preferred embodiment of the present invention, the shaping layer 104 is formed from a metal, in which case the metal is removed between the memory elements following patterning of the shaping layer, and the space which is formed is filled with an insulation material.

If the material of the shaping layer 104 is formed from a metal or a metallic material, it is preferable to use ruthenium/ruthenium dioxide ($Ru/RuO_2$) or polysilicon.

Figure 2:
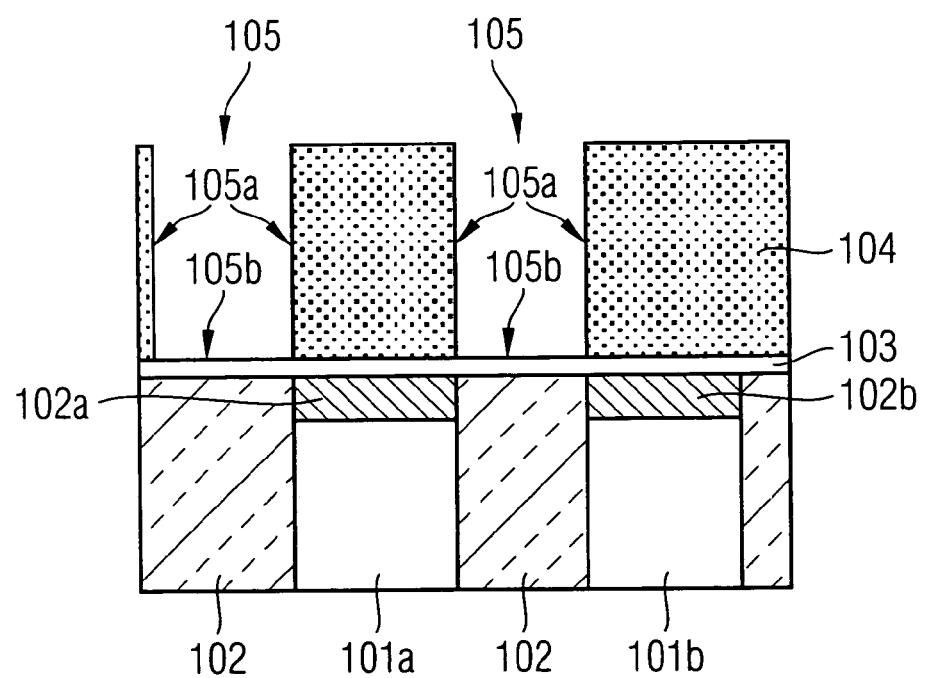
FIG. 2 shows the arrangement shown in FIG. 1 following a process of patterning the shaping layer.

FIG. 2 shows the arrangement illustrated in FIG. 1 after patterning of the shaping layer, in such a manner that vertical trench structures 105 are formed perpendicular to the surface of the driving unit. In the subsequent process steps, the memory elements are formed in these trench structures using ferroelectric material.

The trench structures 105 have side walls 105a and a base 105b, which corresponds to the top side of the stop layer 103. The method according to the invention has the advantage that the trench structures can be provided in such a manner as to allow a chain FeRAM memory cell arrangement. In this case, the select transistor is arranged parallel to the storage capacitor.

A further advantage is that the trench structures have a high aspect ratio. The aspect ratio is preferably greater than 10.

Figure 3:
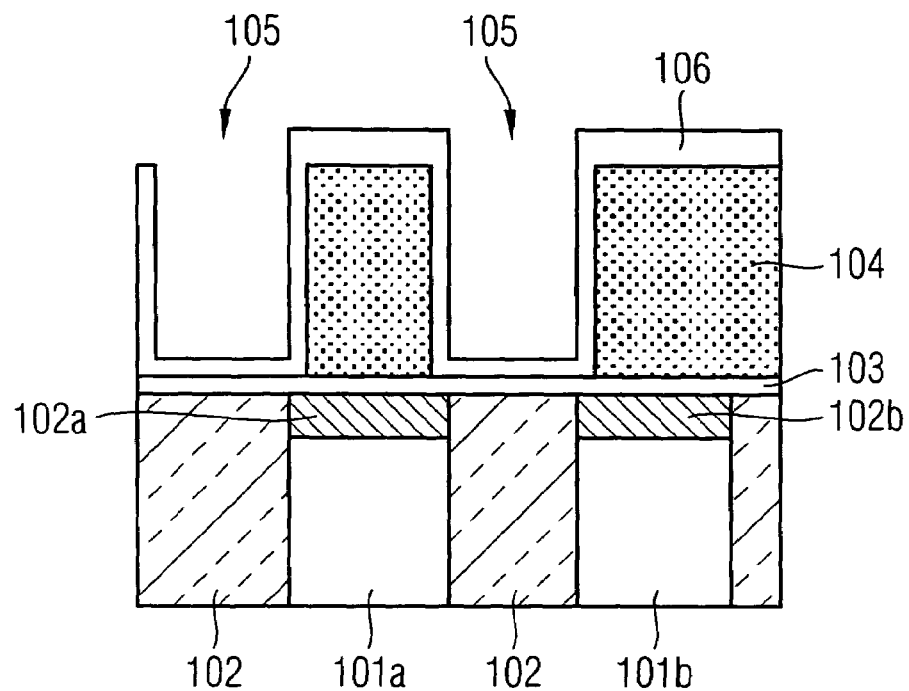
FIG. 3 shows the arrangement shown in FIG. 2 following application of a seed layer to the patterned shaping layer.

FIG. 3 shows the arrangement illustrated in FIG. 2 following deposition of a seed layer 106 on the patterned shaping layer 104, in such a manner that the seed layer 106 covers the side walls 105a and the bases 105b of the trench structures. Furthermore, the protruding surfaces of the shaping layer 104 are covered during deposition of the seed layer 106. The seed layer serves as a nucleation layer for a crystallization agent which is subsequently to be applied.

Figure 4:
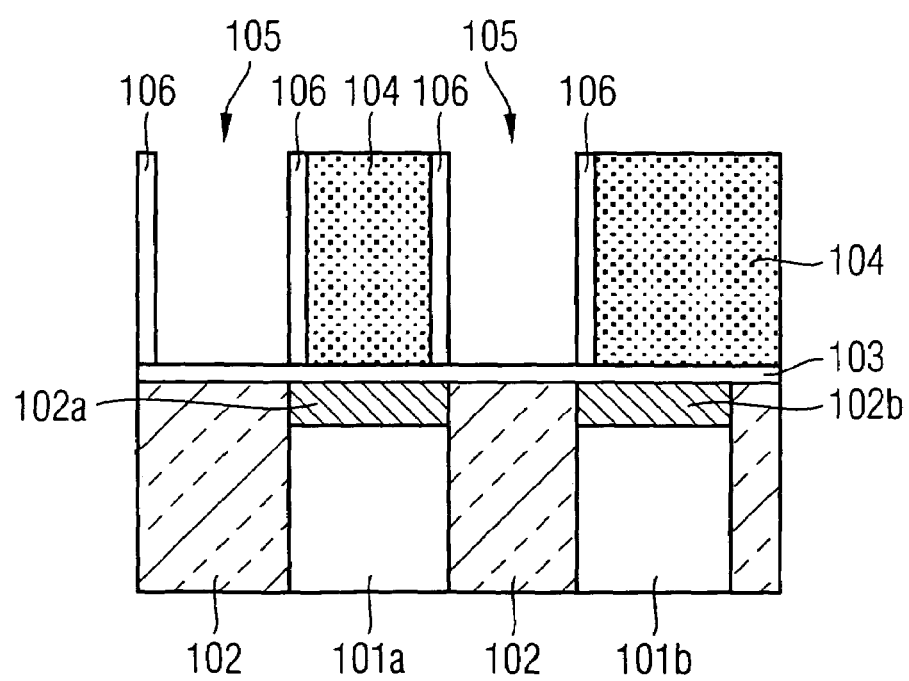
FIG. 4 shows the arrangement shown in FIG. 3 following anisotropic etching of the seed layer, in such a manner that the seed layer is retained on side walls of the trench structures formed in the shaping layer.

FIG. 4 shows the arrangement illustrated in FIG. 3 following removal of those regions of the seed layer 106 which have been deposited in the bases 105b (cf. FIG. 2) and the upper surfaces of the shaping layer 104 (FIG. 3). An etching process of this type is based, for example, on a reactive ion etch, which anisotropically etches layers in such a manner that the seed layer 106 which has been deposited on the side walls 105a of the trench structures 105 (FIG. 2) is retained.

It is therefore ensured, following the process step illustrated in FIG. 4, that a crystallization layer grows horizontally from the side walls. According to the preferred exemplary embodiment of the present invention, the crystallization layer is provided as a PZT layer.

Figure 5:
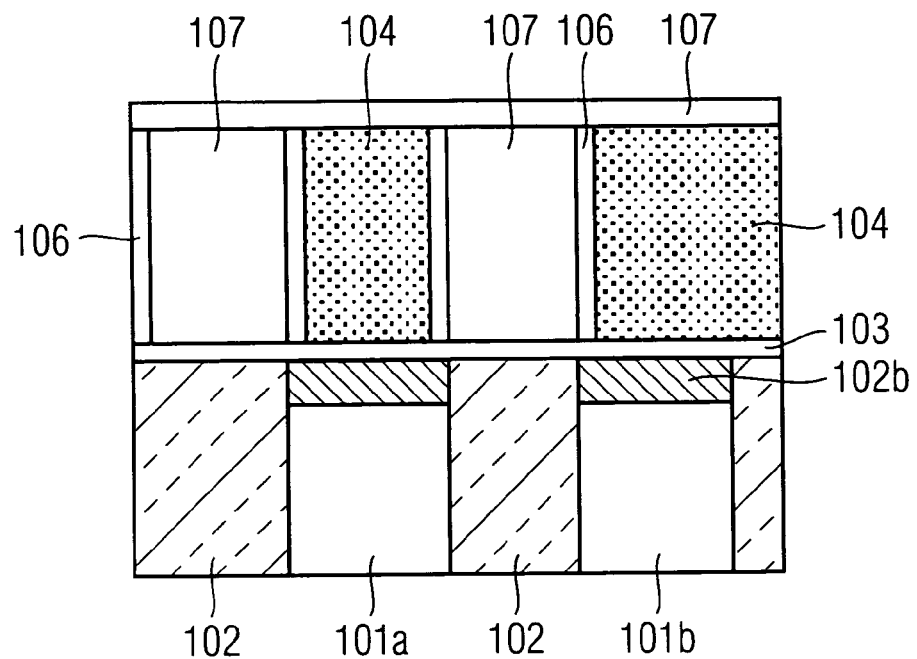
FIG. 5 shows the arrangement shown in FIG. 4 after the trench structures of the shaping layer shown in FIG. 4 have been filled with a crystallization agent.

FIG. 5 shows the arrangement following step (f) described above, i.e. after the trench structures 105 have been filled with the crystallization agent 107. In this case, the seed layer 106 which is present at the side walls 105a of the trench structures 105 ensures that crystallization proceeds in steps from the side walls. The grain boundaries during a crystallization process are formed parallel to the stop layer 103 or perpendicular to the surface of the seed layer 106. It is therefore possible, following application of the capacitor electrodes (described below), for the electric field in the storage capacitor to be oriented parallel to the grain boundaries.

This allows efficient switching of the electric dipole without this switching having to be carried out across grain boundaries. The method according to the invention makes it possible to form stacked capacitors whereof the electrode surfaces are oriented perpendicular to the surface of the substrate 101 or the surface of the stop layer 103. An arrangement of this type makes it possible to provide what is known as a storage capacitor chain architecture (chain FeRAM), resulting in a high storage density in non-volatile PZT-based memory devices of this type.

Figure 6:
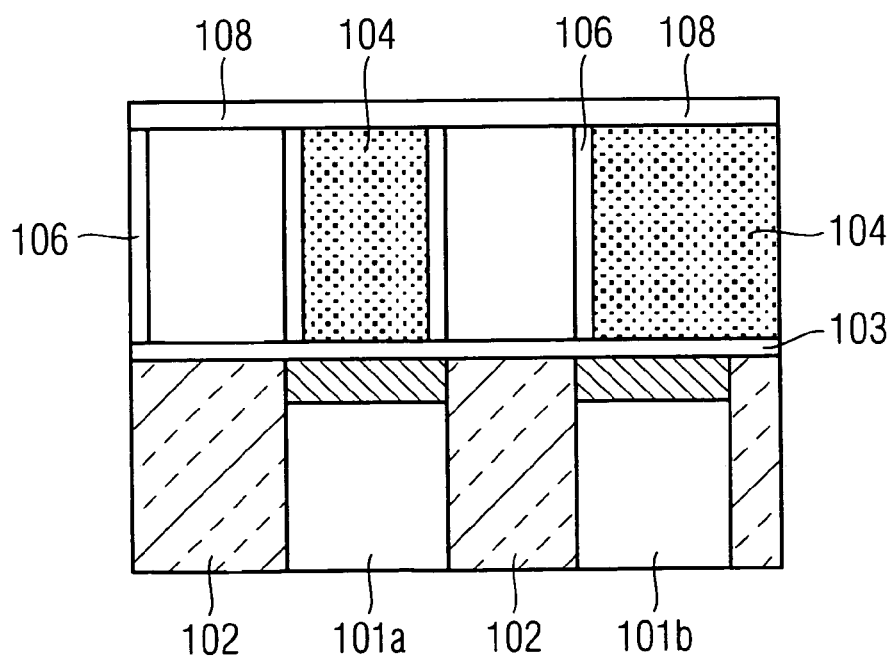
FIG. 6 shows the arrangement shown in FIG. 5 after crystallization of the crystallization agent, in such a manner that grain boundaries of a crystallization filling which forms are oriented perpendicular to the side walls of the trench structures.

FIG. 6 shows the arrangement illustrated in FIG. 5 following the crystallization process, i.e. after the crystallization agent 107 (FIG. 5) has been crystallized in such a manner that grain boundaries of a crystallization filling which forms are oriented perpendicular to the side walls 105a of the trench structures 105.

Figure 7:
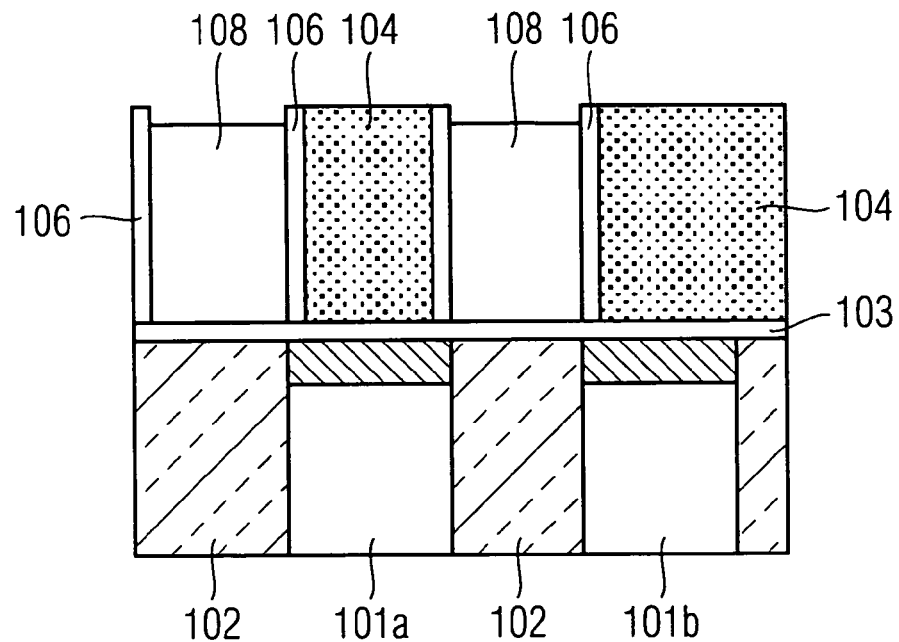
FIG. 7 shows the arrangement shown in FIG. 6 after etching of the crystallization filling at the top side, in such a manner that the surface of the shaping layer is uncovered.

According to the invention, the crystallization process takes place by conditioning at a temperature in a range from 500° C. to 750° C. FIG. 7 shows the arrangement illustrated in FIG. 6 following etching of the upper regions of the crystallization filling 108, in such a manner that the upper surface of the shaping layer 104 is uncovered. Furthermore, a recess is etched in the region of the crystallization filling 108 between the regions of the shaping layer 104.

Figure 8:
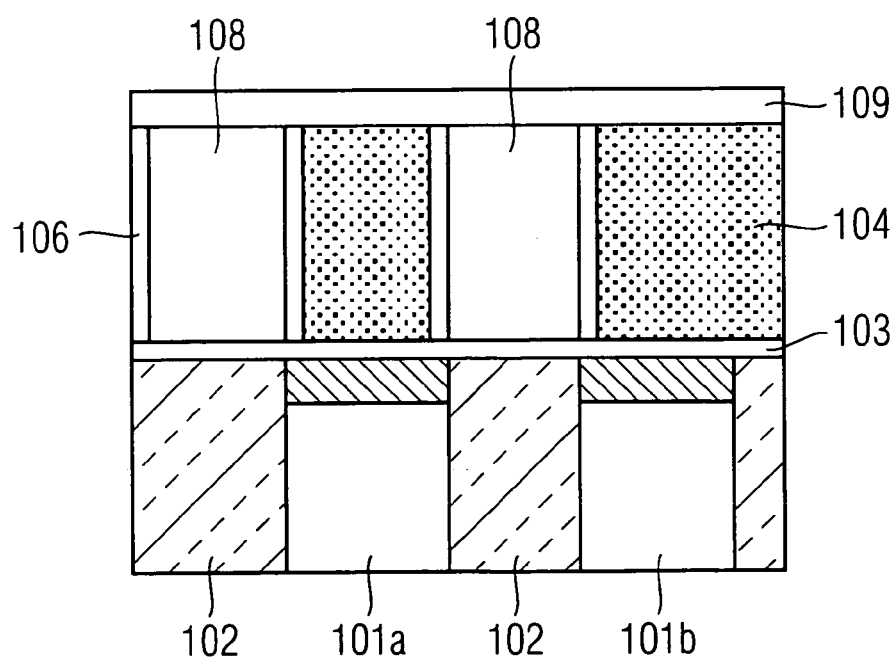
FIG. 8 shows the arrangement shown in FIG. 7 following application of a covering layer 109 to the etched crystallization filling.

Then, as illustrated in FIG. 8, a covering layer 109 is applied to the etched structure, i.e. to the etched regions of the crystallization filling 108 and the uncovered regions of the shaping layer 104. The covering layer preferably consists of a titanium oxide ($TiO_2$) material or an aluminium oxide ($Al_2O_3$) material, in order to provide selectivity for a subsequent etch of electrode holes 110 (described below with reference to FIG. 10). To further improve the selectivity, it is possible to use a double layer of titanium oxide or aluminium oxide and amorphous silicon, since amorphous silicon represents a very good mask layer for etching silicon dioxide, from which the shaping layer 104 is formed in accordance with the first preferred exemplary embodiment of the present invention.

Figure 9:
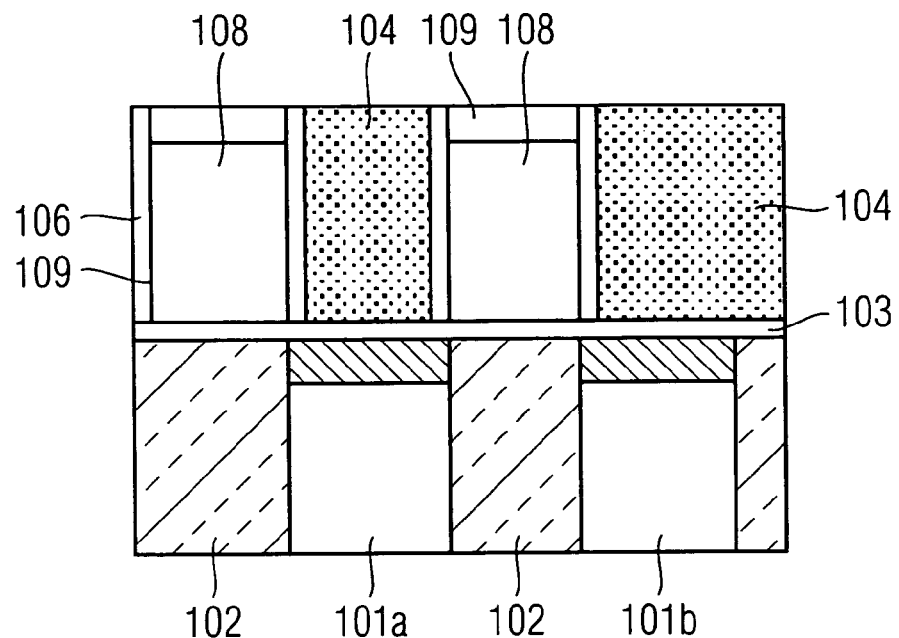
FIG. 9 shows the arrangement shown in FIG. 8 after a chemical-mechanical polishing process has been carried out on the covering layer, in such a manner that a region comprising part of the covering layer is retained on the surface of the crystallization filling.

FIG. 9 shows the arrangement illustrated in FIG. 8 following chemical-mechanical polishing (CMP) of the covering layer 109, in such a manner that the covering layer is partly retained on the surfaces of the crystallization filling 108 but is removed on the surfaces of the shaping layer. Therefore, the crystallization filling 108 is protected in a subsequent etching process, whereas the shaping layer 104 can be removed efficiently.

Figure 10:
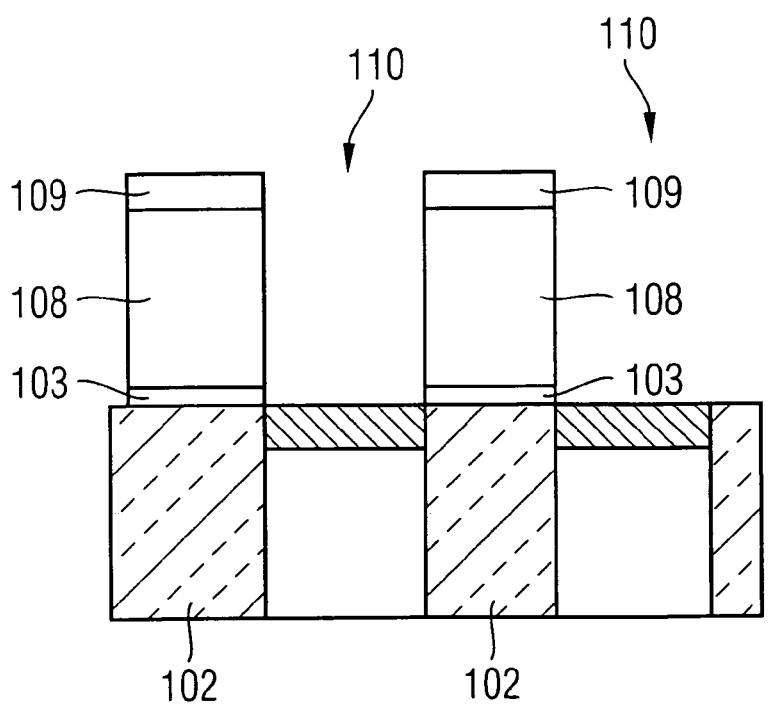
FIG. 10 shows the arrangement shown in FIG. 9 following the removal of the shaping layer, in such a manner that raised structures of the crystallization filling are retained.

FIG. 10 shows the state following removal of the shaping layer 104, which is preferably effected by an anisotropic etching process. The etching process is carried out selectively with respect to the crystallization filling 108, for example by an RIE (reactive ion etching) process. In this way, electrode holes 110 which serve to accommodate the electrode structures are formed in the arrangement shown in FIG. 10.

Figure 11:
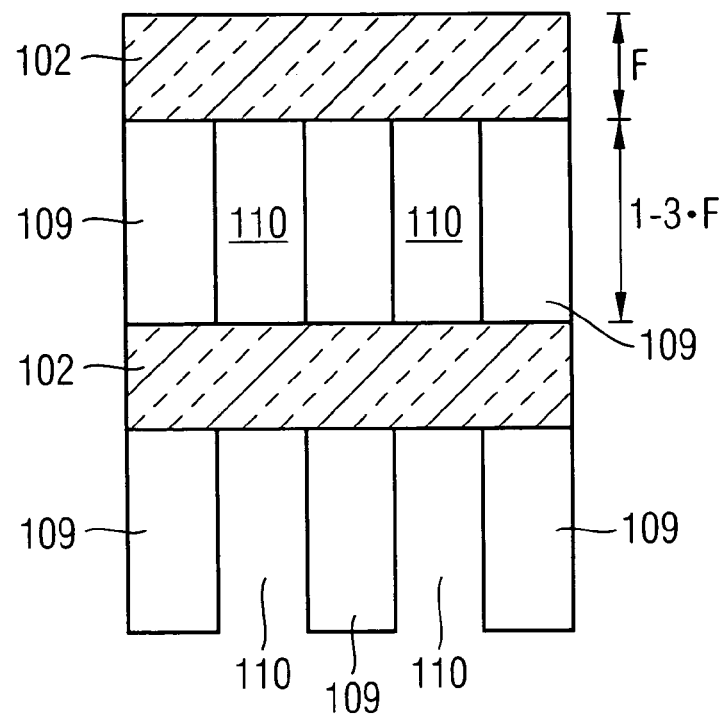
FIG. 11 shows a plan view of the arrangement shown in FIG. 10.

FIG. 11 shows a plan view of the arrangement illustrated in FIG. 10. Here, the dimensions in a direction of the memory cells which is parallel to the surface of the stop layer are approximately 1 to 3 times as large as the width of the insulation layer 102 between them. If the width of the insulation layer 102 is F, the width of the memory cell elements is 1-3*F.

Figure 12:
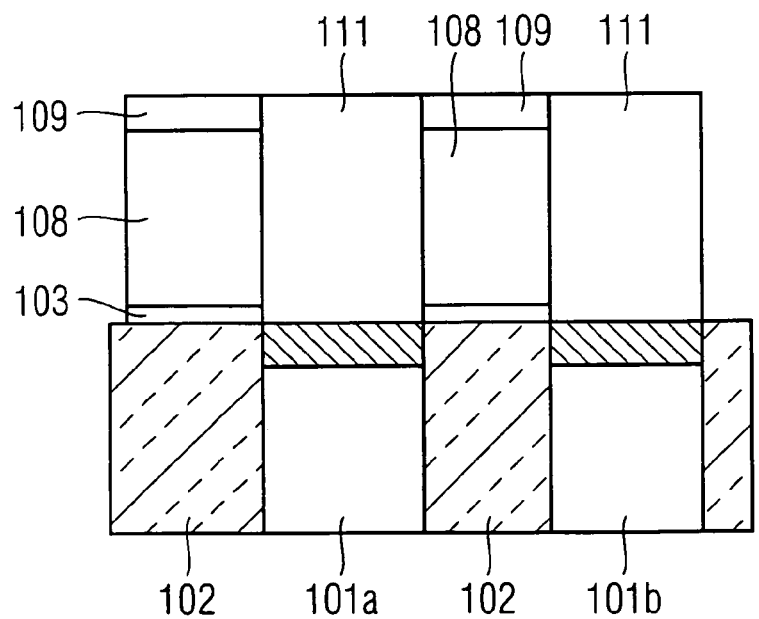
FIG. 12 shows the arrangement shown in FIG. 10 following deposition of an electrode material in electrode holes which have been formed by removal of the shaping layer.

FIG. 12 shows the arrangement illustrated in FIG. 10 following deposition of an electrode material 111 in the electrode holes 110. According to the preferred exemplary embodiment of the present invention, the electrode material 111 preferably consists of ruthenium oxide or iridium oxide. A chemical-mechanical polishing process has to be carried out after deposition of the electrode material 111 in the electrode holes, in order to separate the electrodes of the capacitors from one another.

Figure 13:
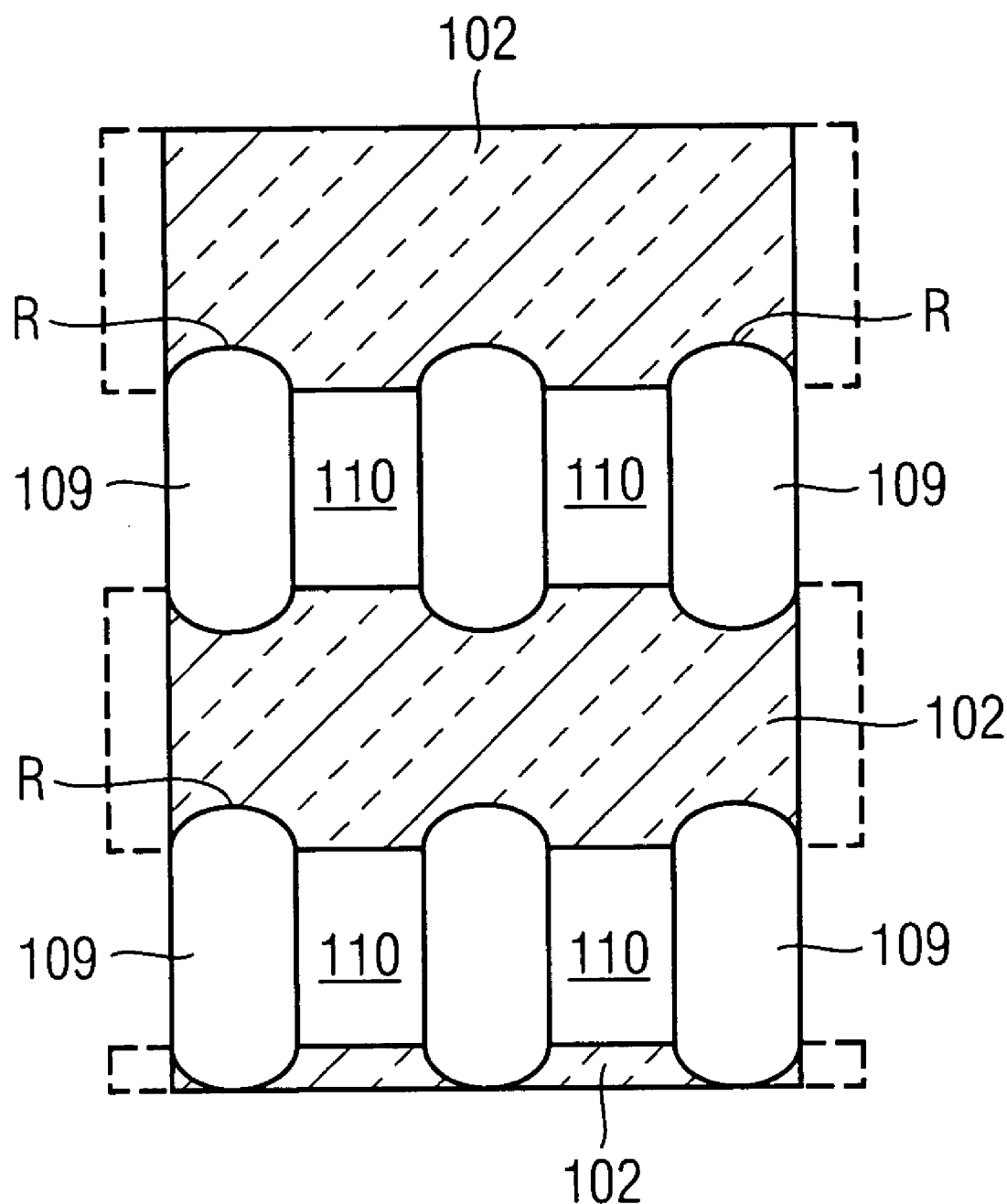
FIG. 13 shows a plan view which corresponds to that shown in FIG. 11 in accordance with another preferred exemplary embodiment of the present invention.

According to a further preferred exemplary embodiment, the capacitor elements shown in plan view in FIG. 11 take an elongate form in the shaping layer 104. In this case, the region of the crystallization filling 108 extends into the insulation layer regions 102, in such a manner as to form roundings R, as illustrated in FIG. 13. This ensures that the side faces of the electrode holes 110 are parallel to one another, in such a manner that parallelism of the electrodes is provided after the electrode material 111 has been deposited in the electrode holes 110.

FIG. 14 shows the use of a metal material, such as for example ruthenium or ruthenium dioxide, as the shaping layer 104. FIG. 14(a) illustrates a plan view of the regions of the insulation layer 102. Furthermore, FIG. 14(b) shows deposition of the shaping layer 104, which in this preferred exemplary embodiment of the present invention consists of a polysilicon material. FIG. 14(b) shows a mask M with which it is possible to remove regions of the shaping layer 104 in order to form a trench structure 105.

Figure 15C:
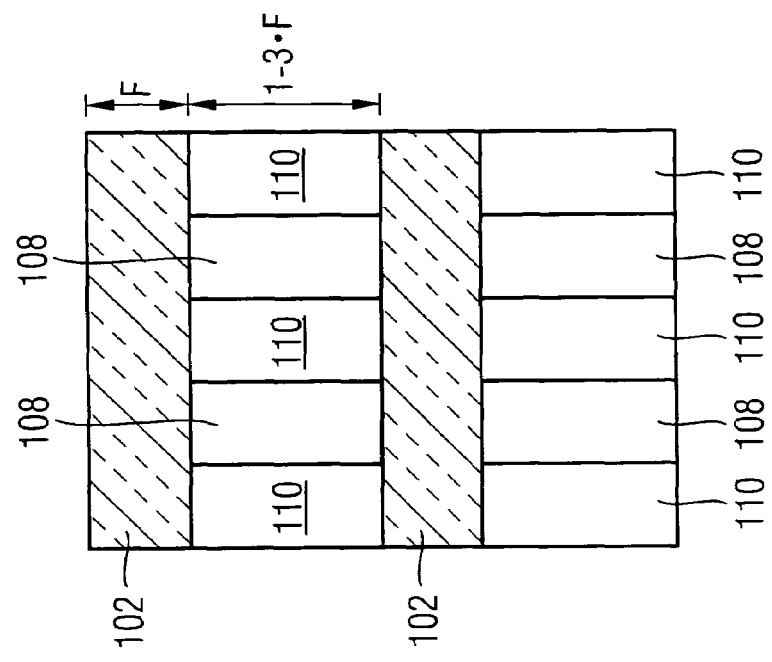
FIGS. 15(a), (b) and (c) show further process steps, which follow the process steps shown in FIG. 14, in accordance with the further exemplary embodiment of the present invention.
Figure 15B:
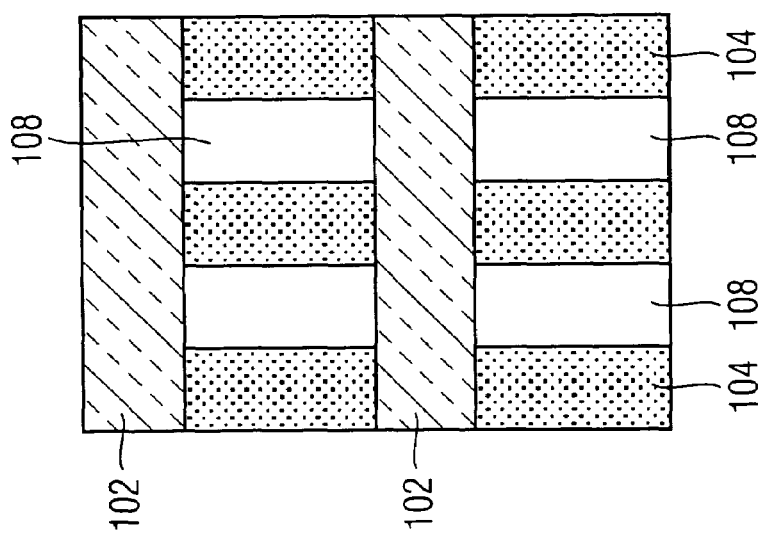
Figure 15A:
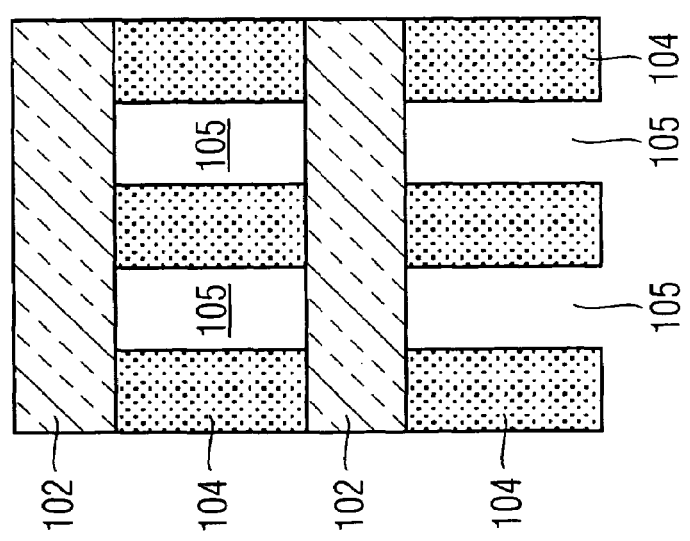

FIG. 15(a) shows the state following etching of the trench structures 105, showing regions of the shaping layer 104 and of the insulation layer 102. As shown above with reference to the first preferred exemplary embodiment of the present invention, a crystallization agent 107 is introduced into the trench structure 105 and is crystallized, in such a manner as to obtain a crystallization filling 108, as illustrated in FIG. 15(b). Then, the shaping layer 104 is removed, in such a manner that individual regions of the crystallization filling 108 which form a chain structure of the memory elements are retained, as illustrated in FIG. 15(c). In this case, the width dimensions of the regions of the crystallization filling 108 are approximately 1-3*F, where F represents the width of the insulation layer 102 (FIG. 15(c)).

Therefore, with the process steps shown in FIGS. 14 and 15, it is possible first of all to alternately apply strips of polysilicon and silicon dioxide and then to etch these strips with the aid of the mask M shown in FIG. 14(c), in such a manner as to produce the chain structure of the memory cell arrangement. As in the first preferred exemplary embodiment of the present invention, the space between the uncovered regions of the crystallization filling 108, i.e. the electrode holes 110, in the second exemplary embodiment too is then filled with an electrode material 111, although this is not illustrated in FIG. 15.

Furthermore, it is possible, in the process step shown in FIG. 14(b), to use alternating strips of ruthenium/ruthenium dioxide and silicon dioxide.

Therefore, the present invention provides a method for fabricating memory cells which include a ferroelectric material. Memory cells of this type advantageously allow nonvolatile memory devices which have a high storage density. The combination of the vertical ferroelectric capacitors with a chain FeRAM arrangement allows memory devices with a high storage density combined with inexpensive fabrication of the associated memory cells.

Although the present invention has been described above on the basis of preferred exemplary embodiments, it is not restricted to these particular embodiments, but rather can be modified in numerous ways.

Also, the invention is not restricted to the possible applications mentioned.

LIST OF DESIGNATIONS

In the figures, identical designations denote identical or functionally equivalent components or steps.
100 Driving unit
101 Substrate
101a, 101b Select transistor units with terminal elements consisting of tungsten material
102 Insulation layer
102a, 102b Diffusion barrier layer
103 Stop layer
104 Shaping layer
105 Trench structure
105a Side wall
105b Base
106 Seed layer
107 Crystallization agent
108 Crystallization filling
109 Covering layer
110 Electrode holes
111 Electrode material

What is claimed is:

1. A method for fabricating a memory device which includes memory cells and devices for causing the memory cells to respond, comprising the steps of:
   a) forming a microstructured driving unit for driving memory cells, by providing a substrate having an insulation layer deposited thereon, in which insulation layer select transistor units, each with diffusion barrier layers applied to them, are embedded;
   b) depositing a stop layer formed from an aluminium oxide material on the microstructured driving unit;

c) depositing a shaping layer on the stop layer;

d) patterning the deposited shaping layer, in such a manner that vertical trench structures are formed perpendicular to the surface of the driving unit;

e) depositing a seed layer on the patterned shaping layer, in such a manner that the seed layer covers side walls and a base of the trench structures, the seed layer consisting of a titanium oxide material;

f) filling the trench structures with a crystallization agent;

g) crystallizing the crystallization agent, in such a manner that grain boundaries of a crystallization filling which forms are oriented perpendicular to the side walls of the trench structures;

h) etching the crystallization filling at the top side of the layer stack formed in steps a) to g), in such a manner that the surface of the shaping layer is uncovered;

i) depositing a covering layer on the etched crystallization filling and the uncovered regions of the shaping layer;

j) chemical-mechanical polishing the covering layer, in such a manner that a region comprising a part of the covering layer is retained on the surface of the crystallization filling;

k) removing the shaping layer and the side regions of the seed layer, in such a manner that electrode holes are formed; and l) depositing an electrode material in the electrode holes.

2. Method according to claim 1, wherein the substrate is formed from a silicon material.

3. Method according to claim 1, wherein the insulation layer is formed from a silicon dioxide material.

4. Method according to claim 1, wherein the select transistor units comprise terminal elements composed of a tungsten material.

5. Method according to claim 1, wherein the diffusion barrier layers which are in each case applied to the select transistor units comprise an iridium/iridium oxide layer stack.

6. Method according to claim 1, wherein the shaping layer is provided in the form of an insulation material.

7. Method according to claim 6, wherein the insulation material of the shaping layer is formed from silicon dioxide.

8. Method according to claim 1, wherein the shaping layer is formed from a metal or a metallic material, and the method comprises the steps of a) removing the metal or the metallic material following the step d) of patterning the shaping layer between the memory elements; and b) filling the space which is formed with an insulation material.

9. Method according to claim 8, wherein the metal or the metallic material consists of ruthenium/ruthenium dioxide or polysilicon.

10. Method according to claim 8, wherein the insulation material consists of silicon dioxide.

11. Method according to claim 1, wherein patterning the deposited shaping layer in such a manner that the vertical trench structures are formed perpendicular to the surface of the driving unit provides the vertical trench structures in an aspect ratio of greater than 10.

12. Method according to claim 1, wherein patterning the deposited shaping layer elongates the vertical trench structures in a direction parallel to the substrate.

13. Method according to claim 1, wherein the seed layer is deposited on the patterned shaping layer by means of an atomic layer deposition process.

14. Method according to claim 1, wherein the seed layer is removed from the bases of the trench structures prior to step f) of filling the trench structures with a crystallization agent.

15. Method according to claim 1, wherein the crystallization of the crystallization agent is carried out at a temperature in a range from 500° C. to 750° C.

16. Method according to claim 14, wherein the seed layer is removed from the bases of the trench structures by means of an anisotropic etching process.

17. Method according to claim 1, wherein the crystallization agent is formed from a lead zirconate titanate material.

18. Method according to claim 1, wherein the removal of the shaping layer in step k) is carried out selectively with respect to the crystallization filling by means of an anisotropic etching process.

19. Method according to claim 1, wherein the electrode material contains ruthenium oxide and/or iridium oxide.

20. Ferroelectric memory cell fabricated using a method according to claim 1.

21. Memory device having at least one memory cell according to claim 20.

* * * * *